US006484394B1

(12) United States Patent
Heo et al.

(10) Patent No.: US 6,484,394 B1
(45) Date of Patent: Nov. 26, 2002

(54) ENCAPSULATION METHOD FOR BALL GRID ARRAY SEMICONDUCTOR PACKAGE

(75) Inventors: Seong-Jae Heo, Cheongju (KR); Chi-Jung Song, Daejon (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/480,005

(22) Filed: Jan. 10, 2000

(30) Foreign Application Priority Data

Nov. 1, 1999 (KR) ........................................... 406/1999

(51) Int. Cl.[7] ................................................. H05K 3/30
(52) U.S. Cl. ........................................... 29/841; 29/840
(58) Field of Search .......................... 29/827, 840, 841, 29/842, 855; 264/274.11, 274.15, 274.17; 257/667, 675, 669, 674; 156/230

(56) References Cited

U.S. PATENT DOCUMENTS 5,525,547 A * 6/1996 Matsunaga et al. ......... 437/211

FOREIGN PATENT DOCUMENTS

| | | |
|---|---|---|
| JP | 3-262618 | * 11/1991 |
| JP | 4-18399 | * 1/1992 |
| JP | 6-238709 | * 8/1994 |
| JP | 6-283828 | * 10/1994 |

* cited by examiner

*Primary Examiner*—Carl J. Arbes
*Assistant Examiner*—Sean Smith
(74) *Attorney, Agent, or Firm*—Birch, Stewart, Kolasch & Birch, LLP

(57) ABSTRACT

An encapsulation method for a ball grid array (BGA) semiconductor package, includes: adhering one sided adhesive tape to an upper portion of the semiconductor package after performing a wire bonding; carrying out a molding by using a mold having a groove of a certain size inside; and removing the one side adhesive tape after completing the molding, whereby a flash is prevented from occurring during the BGA encapsulation process.

14 Claims, 3 Drawing Sheets

ENCAPSULATION METHOD FOR BALL GRID ARRAY SEMICONDUCTOR PACKAGE

BACKGROUND OF THE INVENTION

1. Field of the Invention

The present invention is directed to a ball grid array (BGA) package process used in package processes for a semiconductor device, and in particular to an encapsulation method for a BGA semiconductor package which can prevent a flash from occurring during a molding process of the BGA semiconductor package.

2. Description of the Background Art

A ball grid array (BGA) semiconductor package has been widely used because it can be used to form several pins in a limited area. Further, the BGA semiconductor package includes short external terminals, thereby preventing bending by an external shock and easily transferring an electric signal.

FIG. 1 is a plan view illustrating a printed circuit board before carrying out a conventional encapsulation process for the BGA semiconductor package. FIG. 2 is a cross sectional view illustrating the printed circuit board for explaining the encapsulation process for the BGA semiconductor package. As depicted in FIG. 2, reference numerals 1 to 7 respectively indicate a dispenser 1 for injecting a liquid epoxy, a semiconductor chip 2, a wire 3, a dam 4 for preventing a flash from occurring, a printed circuit board 5, a frame 6 and a liquid epoxy spread 7 within the dam. Three units are configured in a single set in FIGS. 1 and 2.

A conventional encapsulation method for the BGA semiconductor package will now be described with reference to FIGS. 1 and 2.

The chip 2 is bonded on the frame 6 with an adhesive by a die attach process. The bonded chip 2 is electrically connected to the board 5 by using the wire 3.

In order to protect the wire 3, an encapsulation process spreading the liquid epoxy is carried out. Here, the dam 4 of a certain height is provided to prevent the liquid epoxy discharged from the dispenser 1 from being spread. When the liquid epoxy 7 is injected by the dispenser 1, the chip 1 and wire 3 are sealed up by the liquid epoxy 7. Here, a height of the dam is set approximately a few tens of $\mu$m.

In general, the package process is performed on a plurality of units composing a single set. When it is presumed that three units compose a set, as shown in FIG. 2, the afore mentioned encapsulation process must be performed three times. That is, the dispenser 1 is positioned on a first unit, and when the liquid epoxy 7 is completely spread, the dispenser 1 is transferred to a second unit. Accordingly, it takes a longer time to carry out the encapsulation process on the three units than on a single unit by three times.

By contrast, processes other than the encapsulation process are simultaneously performed on the units composing a single set. Therefore, if the encapsulation process takes a longer time, it results in a time increase of the entire manufacturing process.

In addition, an overflow of the liquid epoxy over the dam will cause a flash. Thus, to prevent the flash from occuring the process must be precisely performed.

There is still another advantage in that the dispenser and encapsulation instruments for using the dispenser are high priced.

In order to prevent the flash from occurring, a method of covering an upper portion of the package may be employed where a molding is performed with a mold and the liquid epoxy is injected through the mold. However, this method also requires a precise process, and thus it is difficult to manage the process.

SUMMARY OF THE INVENTION

The present invention is directed to a system that substantially obviates one or more of the problems experienced due to the above and other limitations and disadvantages of the related art.

It is thus an object of the present invention to provide an encapsulation method for a ball grid array (BGA) semiconductor package capable of preventing a flash from occurring during an encapsulation process.

It is another object of the present invention to provide an encapsulation method for a BGA semiconductor package which can simultaneously carry out an encapsulation process on a set consisting of a plurality of units.

It is still another object of the present invention to provide an encapsulation method for a BGA semiconductor package which can prevent a flash from occurring without using a dam.

Other and further objects, features and advantages of the present invention will be set forth in the description that follows, and in part will become apparent from the detailed description, or may be learned by practice of the invention.

To achieve these and other advantages and in accordance with the purpose of the present invention, as embodied and broadly described, the present invention includes an encapsulation method for a BGA semiconductor package, including: adhering an one side adhesive tape with a cavity of a certain size at its center portion to an upper portion of a printed circuit board after performing a wire bonding; carrying out a molding by using a mold; and removing the one side adhesive tape when the molding is completed.

It is to be understood that both the foregoing general description and the following detailed description are exemplary and explanatory and are intended to provide further explanation of the invention as claimed. Thus, it should be understood that the detailed description and specific examples, while indicating preferred embodiments of the invention, are given by way of example only. Various changes and modifications that are within the spirit and scope of the invention will become apparent to those skilled in the art from this detailed description. In fact, other objects, features and characteristics of the present invention; methods, operation, and functions of the related elements of the structure; combinations of parts; and economies of manufacture will surely become apparent from the following detailed description of the preferred embodiments and accompanying drawings, all of which form a part of this specification, wherein like reference numerals designate corresponding parts in various figures.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

A molding of a semiconductor package according to a preferred embodiment of the present invention will now be described in detail.

Figure 1:
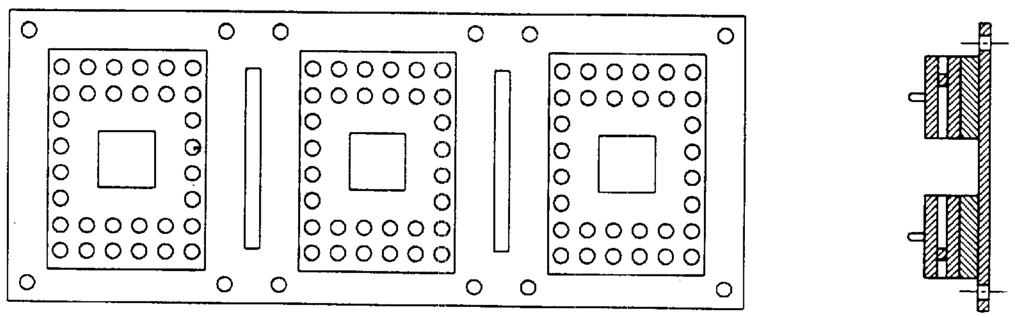
FIG. 1 is a plan view illustrating a semiconductor package for carrying out an encapsulation process on a conventional ball grid array (BGA) semiconductor package.
Figure 2:
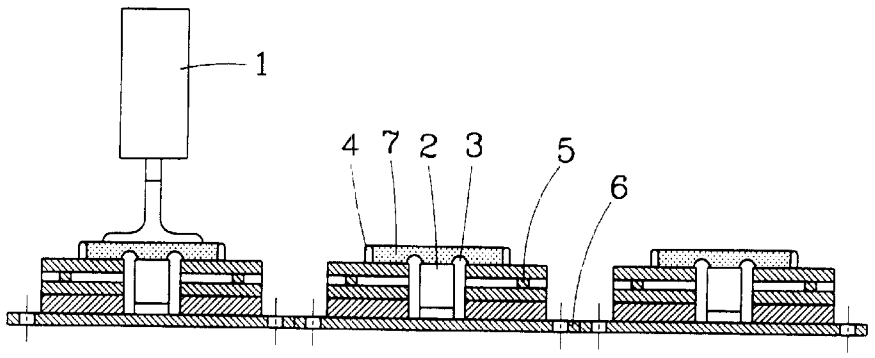
FIG. 2 is a cross sectional view illustrating the semiconductor package showing the encapsulation process of the conventional BGA semiconductor package.
Figure 3:
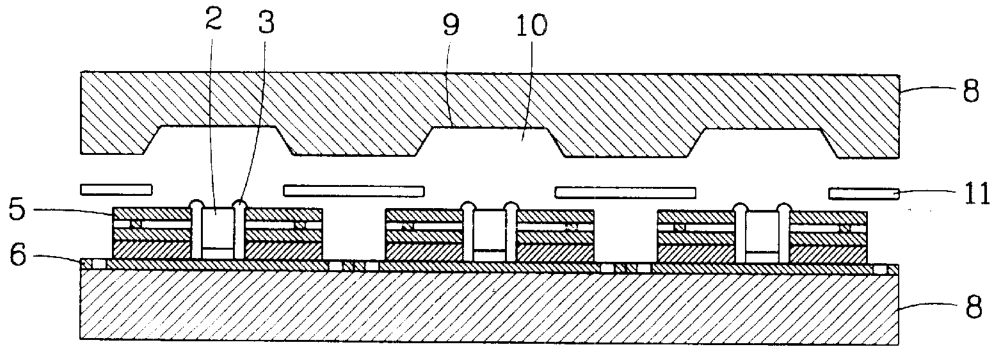
FIG. 3 is a cross sectional view illustrating a semiconductor package for explaining an encapsulation method for a BGA semiconductor package according to a preferred embodiment of the present invention.

FIG. 3 is a cross sectional view illustrating a semiconductor package for explaining an encapsulation method for a ball grid array (BGA) semiconductor package according to a first embodiment of the present invention. As depicted in FIG. 3, the wire bonding is completely carried out on the semiconductor package. A semiconductor chip 2, a wire 3, a printed circuit board 5 and a frame 6 are shown in FIG. 3. A one side adhesive tape 11 is adhered to an upper portion of the printed circuit board 5. The entire package including the one side adhesive tape 11 is surrounded by a mold 8.

A groove 9 of a certain size is formed at an upper portion of the mold 8.

Figure 4A:
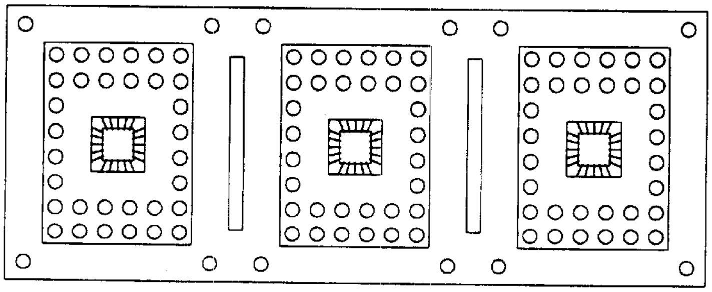
FIG. 4A is a plan view illustrating the semiconductor package in FIG. 3.
Figure 4B:
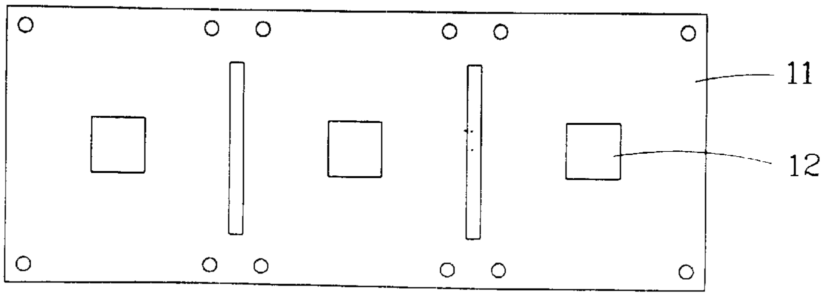
FIG. 4B is a plan view illustrating an one side adhesive tape in FIG. 3.

FIG. 4A is a plan view illustrating the semiconductor package in FIG. 3 wherein the wire bonding is completed. FIG. 4B is a plan view illustrating the one side adhesive tape 11 in FIG. 3 which is identical in size to the semiconductor substrate in FIG. 4A and has a cavity 12 of a certain size at its center portion. The size of the cavity 12 may be set identically to an area surrounded by the dam used for the conventional art, and may be slightly larger or smaller than a size of the groove 9 of the mold 8. The thickness of the one side adhesive tape 12 is approximately 20 $\mu$m, and an adhesive is spread at one side thereof.

The wire bonding processes are performed in accordance with methods well known to those of ordinary skill, such as the methods described with respect to the background art.

After the wire bonding is completely performed, the one side adhesive tape 11 is adhered to the upper portion of the printed circuit board 5. It can be easily adhered to the package because the adhesive is spread at its lower portion.

When the one side adhesive tape 11 is adhered, a portion that corresponds to the cavity at the upper portion of the package is exposed, and the other portions of the package are covered. The exposed portion is to be sealed up by a liquid epoxy. Certain portions of the chip 2, wire 3 and printed circuit board 5 are exposed.

Then, the entire package including the one side adhesive tape 11 is sealed up with the mold 8. The mold has a through hole (not shown) through which the liquid epoxy is injected.

A space 10 of a certain size is formed between the mold 8 and semiconductor package by the groove 9 formed by the mold 8.

When injected through the through hole, the liquid epoxy is filled in the space 10, thereby sealing up the portion of the chip 2, wire 3 and printed circuit board 5. Then, the mold 8 is removed.

Figure 5:
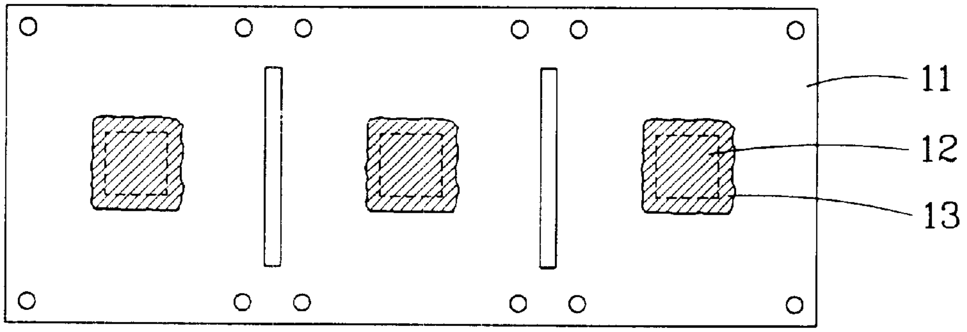
FIG. 5 is a plan view illustrating the semiconductor package after performing the encapsulation process for the BGA semiconductor package according to the preferred embodiment of the present invention.

FIG. 5 is a plan view illustrating the semiconductor package when the mold 8 is removed. As shown therein, the injected liquid epoxy 13 is spread on the printed circuit board 5 including the cavity 12 of the one side adhesive tape 11.

As illustrated in FIG. 5, the area of the spread liquid epoxy 13 is slightly greater than that of the cavity 12 of the one side adhesive tape 11. In this case, the area of the cavity 12 is slightly smaller than the area of the groove 9 of the mold 8. On the other hand, the cavity 12 may be identical in size to the groove 9. Here, the spread liquid epoxy 13 is shown to be identical in size to the cavity 12.

When the one side adhesive tape 11 is removed from the printed circuit board 5, the liquid epoxy 13 spread at the external portion of cavity 12 of the adhesive tape 11, namely the flash, is completely removed, thus finishing the encapsulation process.

Figure 6:
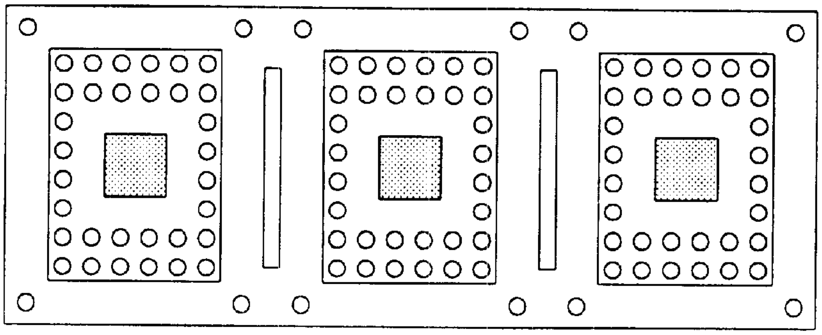
FIG. 6 is a plan view illustrating the semiconductor package from which the one side adhesive tape is removed according to the preferred embodiment of the present invention.

FIG. 6 is a cross sectional view illustrating the semiconductor package when the encapsulation process is completed.

On the other hand, when the molding is being performed, a mold temperature is approximately 200° C. At this temperature, the adhesive of the one side adhesive tape 11 remarkably loses an adhesive property. As a result, the one side adhesive tape 11 can be easily removed after carrying out the molding.

As discussed earlier, the present invention enables the encapsulation process to be performed on the plurality of units at a time, thereby reducing an entire manufacturing time. Reduction of the manufacturing time results in mass production. Also, the dam employed in the conventional art is not used, which results in simplification of the process and reduction of the package manufacturing cost.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example, for the purposes of a continuation or divisional application.

What is claimed is:

1. An encapsulation method for a ball grid array (BGA) semiconductor package, comprising:

adhering adhesive tape to an upper portion of a printed circuit board on which wiring exists, thereby defining a cavity of a predetermined size between adjacent edges of pieces of the adhesive tape;

positioning a mold on the printed circuit board to which the adhesive tape is adhered;

injecting a liquid epoxy through a through hole of the mold to cover the upper portion of the printed circuit board which is exposed through the cavity with the liquid epoxy; and removing the mold and the adhesive tape.

2. The encapsulation method of claim 1, wherein the adhesive tape has adhesive on only one side.

3. The encapsulation method of claim 1, wherein a width of the cavity defined by the adhesive tape is sufficiently large to be sealed up by the liquid epoxy.

4. The encapsulation method of claim 1, wherein a width of the cavity defined by the adhesive tape is smaller than a width of a groove formed at an upper portion of the mold.

5. The encapsulation method of claim 1, wherein a thickness of the adhesive tape is approximately 20 $\mu$m.

6. The encapsulation method of claim 1, wherein an adhesive is spread at a portion of the adhesive tape facing the printed circuit board.

7. The encapsulation method of claim 6, wherein the adhesive loses its adhesive property as the molding is performed.

8. An encapsulation method for a ball grid array semiconductor package, comprising:

adhering adhesive tape to an upper portion of a printed circuit board on which wiring exists, thereby defining a cavity of a predetermined size between adjacent edges of pieces of the adhesive tape;

surrounding the entire package including the adhesive tape with a mold;

injecting a liquid epoxy through a through hole of the mold to cover the upper portion of the printed circuit board which is exposed through the cavity with the liquid epoxy; and removing the mold and the adhesive tape.

9. The encapsulation method of claim 8, wherein the adhesive tape has adhesive on only one side.

10. The encapsulation method of claim 8, wherein a width of the cavity defined by the one side adhesive tape is sufficiently large to be sealed up by the liquid epoxy.

11. The encapsulation method of claim 8, wherein a width of the cavity defined by the adhesive tape is smaller than that of a groove formed at an upper portion of the mold.

12. The encapsulation method of claim 8, wherein a thickness of the adhesive tape is approximately 20 $\mu$m.

13. The encapsulation method of claim 8, wherein an adhesive is spread at a portion of the adhesive tape facing the printed circuit board.

14. The encapsulation method of claim 13, wherein the adhesive loses its adhesive property as the molding is performed.

* * * * *